(12) United States Patent
Su et al.

(10) Patent No.: US 11,894,815 B2
(45) Date of Patent: Feb. 6, 2024

(54) POWER AMPLIFIER AND ELECTRONIC DEVICE

(71) Applicant: SMARTER MICROELECTRONICS (GUANG ZHOU) CO., LTD., Guangzhou (CN)

(72) Inventors: Qiang Su, Guangzhou (CN); Ping Li, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 481 days.

(21) Appl. No.: 17/134,386

(22) Filed: Dec. 26, 2020

(65) Prior Publication Data
US 2021/0126601 A1 Apr. 29, 2021

Related U.S. Application Data

(63) Continuation of application No. PCT/CN2019/127408, filed on Dec. 23, 2019.

(30) Foreign Application Priority Data

Oct. 23, 2019 (CN) .......................... 201911014056.1

(51) Int. Cl.
*H03F 1/22* (2006.01)
*H03F 3/24* (2006.01)
*H03F 1/32* (2006.01)
*H03F 3/195* (2006.01)

(52) U.S. Cl.
CPC ........... *H03F 3/245* (2013.01); *H03F 1/3205* (2013.01); *H03F 3/195* (2013.01); *H03F 2200/451* (2013.01)

(58) Field of Classification Search
CPC ..................................... H03F 1/22; H03F 1/30
USPC .......................................... 330/311, 296, 285
See application file for complete search history.

(56) References Cited

U.S. PATENT DOCUMENTS

| | | | |
|---|---|---|---|
| 8,013,679 B2 * | 9/2011 | Lee ..................... | H03F 3/45475 330/253 |
| 9,455,670 B2 * | 9/2016 | Kovac ....................... | H03F 3/72 |
| 10,931,246 B2 * | 2/2021 | Seshita .................... | H03F 3/193 |

* cited by examiner

*Primary Examiner* — Henry Choe
(74) *Attorney, Agent, or Firm* — Syncoda LLC; Feng Ma

(57) ABSTRACT

A power amplifier includes: a power amplification circuit and a linearity compensation circuit; and herein the linearity compensation circuit is connected between a transistor amplification circuit and a biasing circuit of the power amplification circuit, to linearly compensate a nonlinear distortion of the power amplification circuit.

10 Claims, 4 Drawing Sheets

POWER AMPLIFIER AND ELECTRONIC DEVICE

CROSS-REFERENCE TO RELATED APPLICATIONS

This application is a continuation of International Application No. PCT/CN2019/127408 filed on Dec. 23, 2019, which claims priority to Chinese Patent Application No. 201911014056.1 filed on Oct. 23, 2019. The disclosures of these applications are hereby incorporated by reference in their entirety.

BACKGROUND

With the rapid development of the wireless communication technology, a Radio Frequency (RF) power amplifier plays an increasingly important role in a wireless communication system. The RF power amplifier is used to amplify the power of a modulated RF signal output by a transceiver to meet the power requirement of the RF signal required for wireless communication.

SUMMARY

The present disclosure relates generally to the technical field of electronic circuits, and more specifically to a power amplifier and an electronic device.

According to a first aspect of the disclosure, there is provided a power amplifier, including: a power amplification circuit and a linearity compensation circuit; and Herein, the linearity compensation circuit is connected between a transistor amplification circuit and a biasing circuit of the power amplification circuit, to linearly compensate a nonlinear distortion of the power amplification circuit.

Herein, the transistor amplification circuit includes: a field-effect-transistor amplification circuit or a triode amplification circuit.

Herein, when the transistor amplification circuit is a field-effect-transistor amplification circuit, the linearity compensation circuit includes: a first field-effect transistor, a first resistor, a second resistor, a first capacitor, a second capacitor, and a third capacitor; and Herein, a gate electrode of the first field-effect transistor is connected to a first end of the second resistor, a second end of the second resistor is connected to the biasing circuit, a source electrode of the first field-effect transistor is connected to a first end of the first resistor, a second end of the first resistor is grounded, the first capacitor is connected in parallel with the first resistor, a drain electrode of the first field-effect transistor is connected to a first end of the third capacitor, a second end of the third capacitor is connected to the field-effect-transistor amplification circuit, a first end of the second capacitor is connected to the gate electrode of the first field-effect transistor, and a second end of the second capacitor is grounded.

Herein, the field-effect-transistor amplification circuit is a multistage field-effect-transistor amplification circuit, and a second end of the third capacitor is connected to a gate electrode of a field-effect transistor of a driving stage in the multistage field-effect-transistor amplification circuit.

Herein, each of the field-effect transistors is composed of at least two sub-field-effect transistors that are connected in parallel.

Herein, the field-effect transistor includes at least one of: a Laterally-Diffused Metal-Oxide Semiconductor (LDMOS) transistor, a Silicon-On-Insulator (SOI) transistor, a Complementary Metal Oxide Semiconductor (CMOS) transistor, a homogeneous Bipolar Junction Transistor (BJT) or a heterogeneous BJT.

Herein, the transistor amplification circuit includes a triode-transistor amplification circuit.

According to a second aspect of the disclosure, there is provided an electronic device, herein the electronic device includes the power amplifier described in the above technical solution.

Herein, the power amplifier includes: a power amplification circuit and a linearity compensation circuit; and Herein, the linearity compensation circuit is connected between a transistor amplification circuit and a biasing circuit of the power amplification circuit, to linearly compensate a nonlinear distortion of the power amplification circuit.

Herein, the transistor amplification circuit includes: a field-effect-transistor amplification circuit or a triode amplification circuit.

Herein, when the transistor amplification circuit is a field-effect-transistor amplification circuit, the linearity compensation circuit includes: a first field-effect transistor, a first resistor, a second resistor, a first capacitor, a second capacitor, and a third capacitor; and Herein, a gate electrode of the first field-effect transistor is connected to a first end of the second resistor, a second end of the second resistor is connected to the biasing circuit, a source electrode of the first field-effect transistor is connected to a first end of the first resistor, a second end of the first resistor is grounded, the first capacitor is connected in parallel with the first resistor, a drain electrode of the first field-effect transistor is connected to a first end of the third capacitor, a second end of the third capacitor is connected to the field-effect-transistor amplification circuit, a first end of the second capacitor is connected to the gate electrode of the first field-effect transistor, and a second end of the second capacitor is grounded.

According to embodiments of the present disclosure, the nonlinear distortion of the power amplification circuit can be linearly compensated by connecting the linearity compensation circuit between the biasing circuit of the power amplification circuit and the transistor amplification circuit, thereby increasing the power gain of the power amplifier. In the disclosure, the linear power of the power amplifier can be improved without changing the load impedance, such that the nonlinearity of the power amplifier and the efficiency of the power amplifier can be improved.

BRIEF DESCRIPTION OF THE DRAWINGS

In the accompanying drawings, similar reference numerals may describe similar components in different views. Similar reference numerals with different letter suffixes may indicate different examples of similar components. The accompanying drawings generally illustrate the embodiments discussed herein by way of example rather than limitation.

DETAILED DESCRIPTION

The technical solutions in the embodiments of the disclosure will be described clearly and completely below by combining with the accompanying drawings in the embodiments of the disclosure; obviously, the described embodiments are a part of the embodiments of the disclosure, rather than all of the embodiments. Based on the embodiments of the disclosure, all the other embodiments obtained by those ordinarily skilled in the art without creative work belong to the protection scope of the disclosure. It should be noted that the technical solutions described in the embodiments of the disclosure may be combined arbitrarily with each other without conflict.

With the advent of the fifth-generation (5G) mobile communication network, the wireless communication system has an increasingly stringent requirement for the linearity of the RF power amplifier. Various embodiments of the present disclosure can improve the linearity of the power amplifier.

Figure 1:
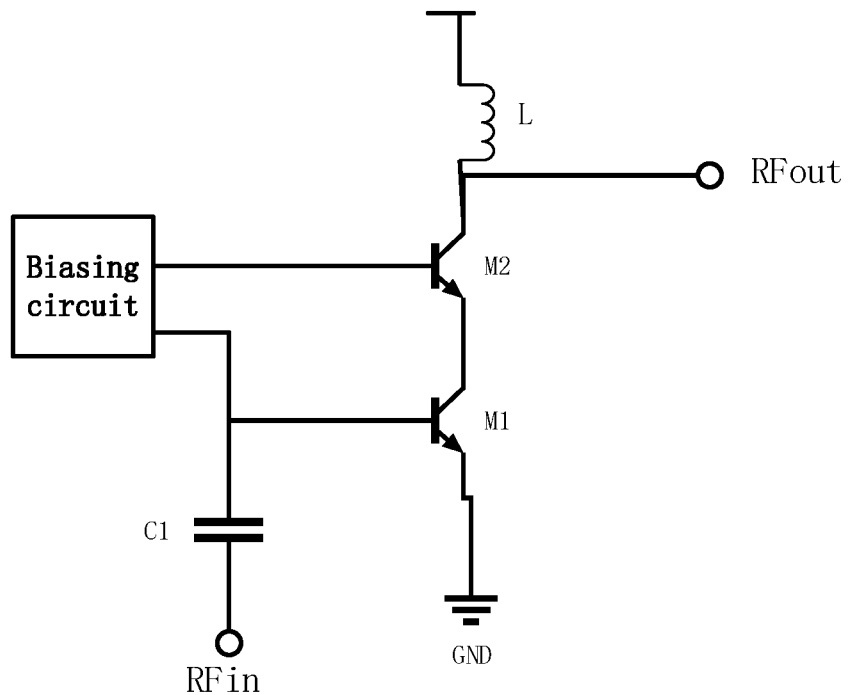
FIG. 1 is a schematic diagram of a circuit structure of a power amplifier according to some embodiments.

Referring to FIG. 1, there is provided a schematic diagram of a circuit structure of a power amplifier according to some embodiments. As shown in FIG. 1, the power amplifier includes: a RF signal input end RFin, a RF signal output end RFout, a biasing circuit, a transistor amplification circuit M1, a transistor amplification circuit M2, an inductor L and a capacitor C1.

Herein, the transistor amplification circuit includes: a field-effect-transistor amplification circuit or a triode amplification circuit. When the transistor amplification circuit M1 is a field-effect-transistor amplification circuit, the RF signal input end RFin is connected to a first end of the capacitor C1, a second end of the capacitor C1 is connected to a gate electrode of the transistor amplification circuit M1, the gate electrode of the transistor amplification circuit M1 is also connected to the biasing circuit, a gate electrode of the transistor amplification circuit M2 is connected to the biasing circuit, a source electrode of the transistor amplification circuit M1 is grounded, a source electrode of the transistor amplification circuit M2 is connected to a drain electrode of the transistor amplification circuit M1, a drain electrode of the transistor amplification circuit M2 is connected with the RF signal output end RFout and a first end of the inductor L, respectively, and a second end of the inductor L is connected to a supply voltage.

In the aforementioned circuit, the biasing circuit refers to an additional circuit that allows the circuit to operate normally. For a power amplifier, the biasing circuit plays a very important role, which determines the operating state of the power amplifier and affects, to a large extent, distortion and stability of an output stage. In different power amplifiers, the biasing circuit may be different, and the specific circuit of the biasing circuit is designed by the technician according to needs.

The transistor amplification circuit plays a role of power amplification in the power amplifier. The transistor amplification circuit may be a field-effect-transistor amplification circuit or a triode amplification circuit. In practical applications, the transistors used in the transistor amplification circuit M1 and the transistor amplifier circuit M2 may be Laterally-Diffused Metal-Oxide Semiconductor (LDMOS) transistors, Silicon-On-Insulator (SOI) transistors, Complementary Metal Oxide Semiconductor (CMOS) transistors, homogeneous Bipolar Junction Transistors (BJTs) or heterogeneous BJTs.

The RF signal output end RFout of the power amplifier is connected in serial with the inductor L, to allow a Direct Current (DC) signal to pass and an Alternating Current (AC) signal to be blocked, so that the AC signal that needs to be amplified could be output from a matching circuit. The other end of the inductor is connected to a DC power supply for powering the transistor amplification circuit.

The RF signal input end RFin of the power amplifier is connected in serial with a capacitor, to allow an AC signal to pass and a DC signal to be isolated. Since signals such as audio signals are AC signals, the serially connected capacitor can isolate DC signals.

Figure 2:
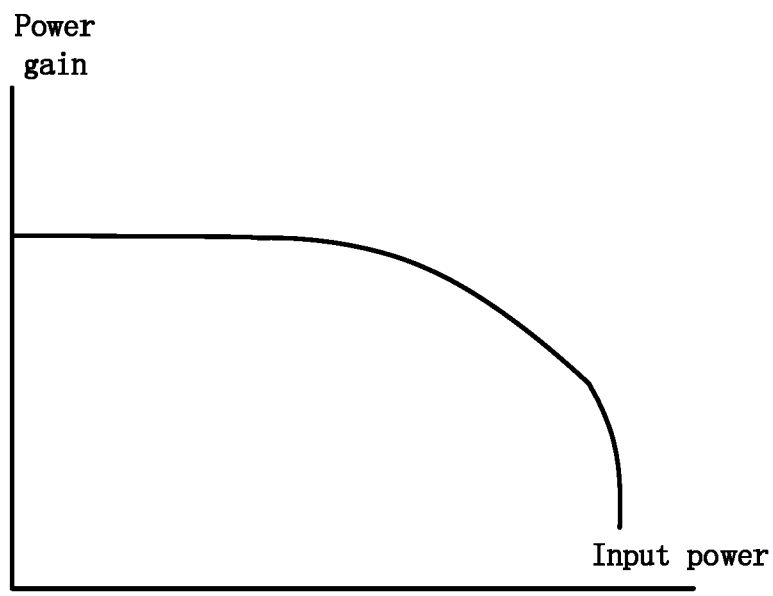
FIG. 2 is a graph of a power gain of a power amplifier varying with the input power, provided according to an embodiment of the disclosure.

Referring to FIG. 2, there is provided a graph of a power gain of a power amplifier varying with the input power, according to an embodiment of the disclosure; herein the power amplifier may be the power amplifier provided by the embodiment shown in FIG. 1. As can be seen in FIG. 2, as the input power increases, the curve begins to bend downward from a straight line, that is, the power gain (Gain) of the power amplifier begins to decrease, which is generally called as an AMplitude-AMplitude (AM-AM) distortion. The AM-AM distortion is one of nonlinear distortions of the power amplifier, and the AM-AM distortion mainly affects an intermodulation index of the power amplifier, which causes an intermodulation distortion of the power amplifier, and causes the input signal to have a spectrum regeneration effect, thus to interfere with adjacent channels and even generate bit errors. At the same time, as the input power increases, the efficiency of the power amplifier is also affected. Therefore, how to improve the linearity of the power amplifier becomes a currently urgent problem to be solved.

Based on the above, in the embodiments of the disclosure, a linearity compensation circuit is added to the circuit of the power amplifier to improve the nonlinearity of the power amplifier. In order to illustrate the technical solutions described in the disclosure, specific embodiments are used for description below.

Figure 3:
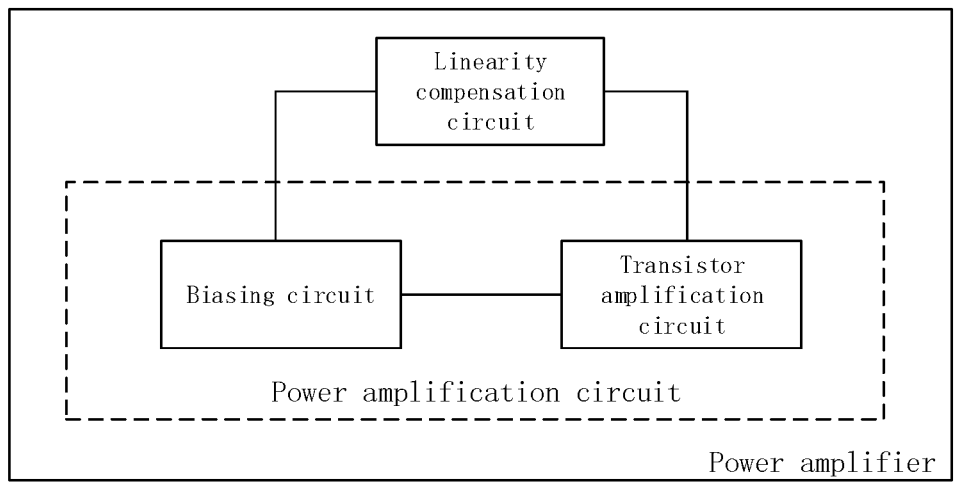
FIG. 3 is a schematic diagram of a structure of a power amplifier, provided according to an embodiment of the disclosure.

Referring to FIG. 3, there is provided a schematic diagram of a structure of a power amplifier, according to an embodiment of the disclosure. As shown in FIG. 3, the power amplifier includes: a power amplification circuit and a linearity compensation circuit.

The linearity compensation circuit is connected between a transistor amplification circuit and a biasing circuit of the power amplification circuit, and the linearity compensation circuit is configured to linearly compensate a nonlinear distortion of the power amplification circuit.

Herein, the power amplification circuit may be any power amplification circuit, for example, it may be the power amplification circuit shown in FIG. 1. The biasing circuit and the transistor amplification circuit are the circuits and components shared by power amplification circuits.

Figure 4:
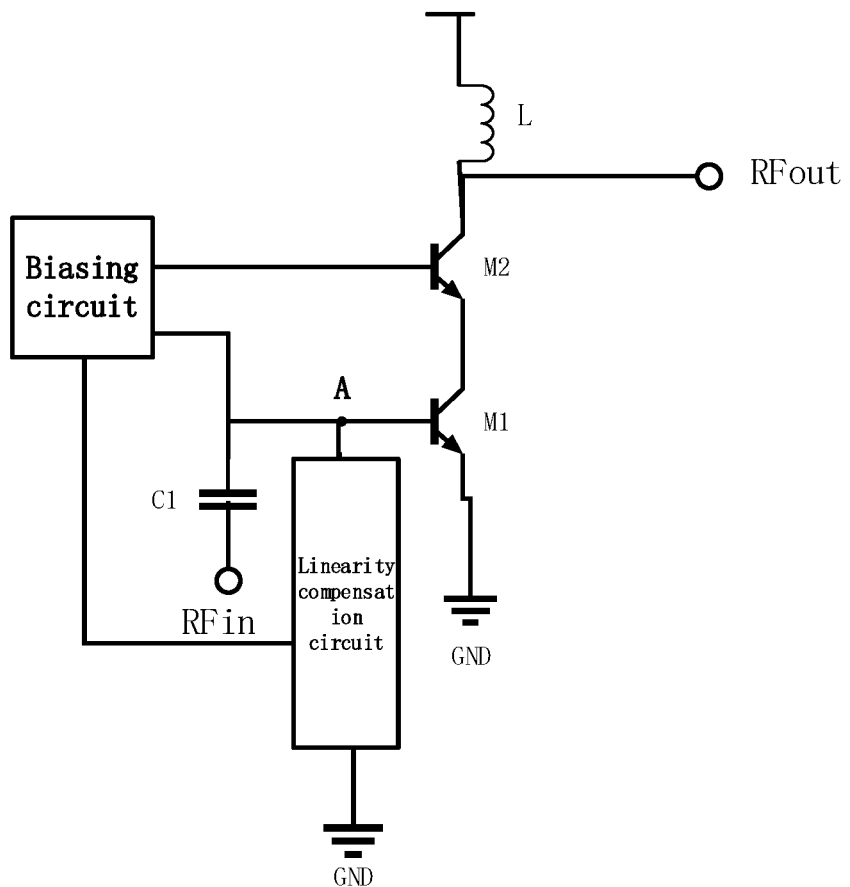
FIG. 4 is a schematic diagram of a circuit structure of a power amplifier, provided according to an embodiment of the disclosure.

Referring to FIG. 4, there is provided a schematic diagram of a circuit structure of a power amplifier, according to an embodiment of the present disclosure. In FIG. 4, the power amplification circuit is the power amplification circuit shown in FIG. 1. It should be understood that the power amplification circuit used in the embodiments of the disclosure may be any power amplification circuit, and the power amplification circuit shown in FIG. 1 is only an example of the power amplification circuit in the embodiments of the disclosure, and is not a limitation of the power amplification circuit in the embodiments of the disclosure.

As shown in FIG. 4, the linearity compensation circuit is connected between a transistor amplification circuit and a biasing circuit of the power amplification circuit. Specifically, a first end of the linearity compensation circuit is connected to a transistor amplification circuit M1, and a second end of the linearity compensation circuit is connected to the biasing circuit.

The linearity compensation circuit is configured to linearly compensate a nonlinear distortion of the power amplification circuit. Specifically, the linearity compensation circuit is configured to reduce a real part of a port admittance of a RF signal input end of the power amplification circuit, when an input power of the power amplification circuit increases. Because the power gain (Gain) of the power amplifier is inversely proportional to the real part of the port admittance of the RF signal input end, that is, Gain∝1/Re{Yin}, where Re{Yin} is the real part of the admittance. The admittance is the reciprocal of the impedance, which means that the greater the impedance is, the smaller the admittance is. And the admittance=a real part+an imaginary part, and the smaller the admittance is, the smaller the real part of the admittance is; when the admittance becomes smaller, the power gain of the power amplifier becomes larger. Therefore, when the input power of the power amplification circuit increases, the real part of the port admittance of the RF signal input end of the power amplification circuit is reduced by the linearity compensation circuit, the power gain of the power amplifier can be increased, and the nonlinearity of the power amplifier can be improved; that is, the nonlinear distortion of the power amplification circuit can be linearly compensated.

Figure 5:
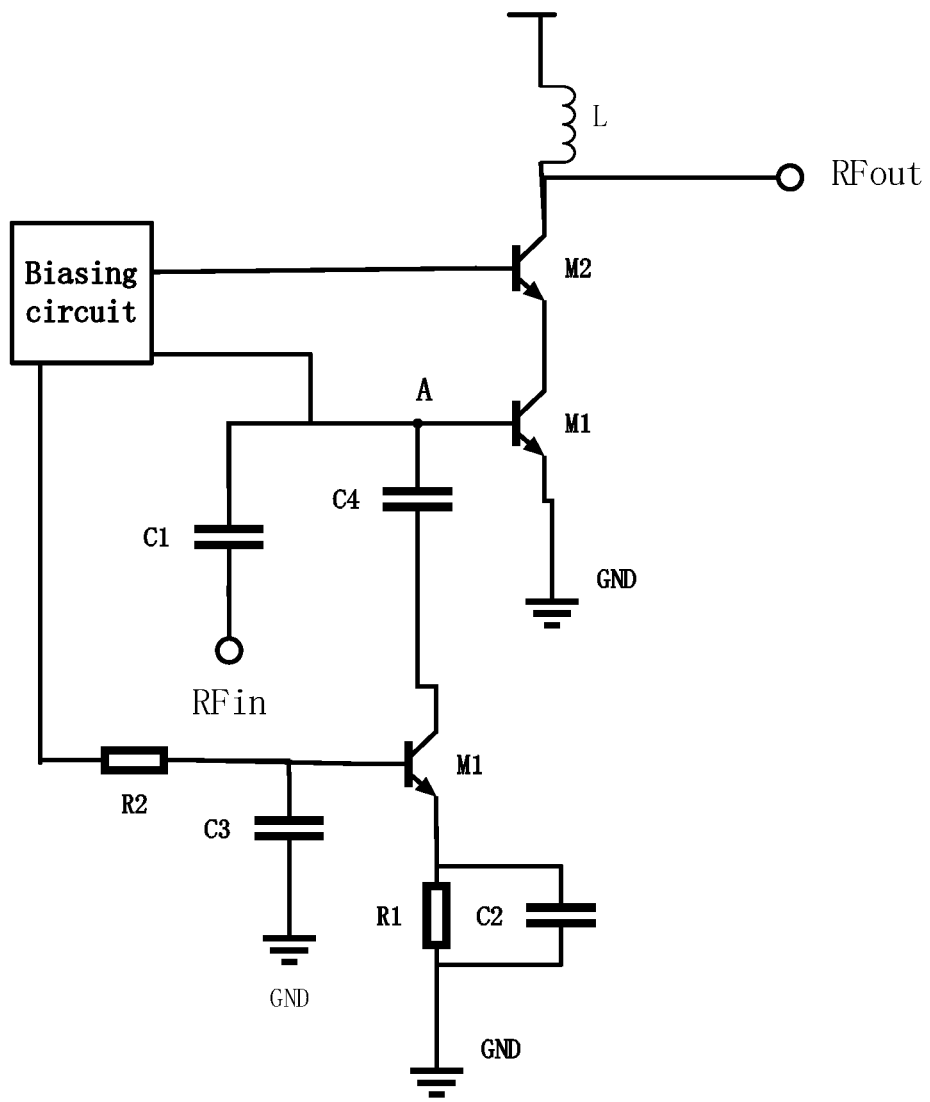
FIG. 5 is a schematic diagram of a circuit structure of another power amplifier, provided according to an embodiment of the disclosure.

For a specific linearity compensation circuit, referring to FIG. 5, there is provided a schematic diagram of a circuit structure of another power amplifier, according to an embodiment of the disclosure. The power amplification circuit in FIG. 5 takes the power amplification circuit shown in FIG. 1 as an example. It should be understood that the power amplification circuit shown in FIG. 1 is only an example of the power amplification circuit in the embodiments of the disclosure, and is not a limitation of the power amplification circuit in the embodiments of the disclosure.

As shown in FIG. 5, the linearity compensation circuit includes: a first field-effect transistor M0, a first resistor R1, a second resistor R2, a first capacitor C2, a second capacitor C3, and a third capacitor C4.

Herein, a gate electrode of the first field-effect transistor M0 is connected to a first end of the second resistor R2, a second end of the second resistor R2 is connected to a biasing circuit of the power amplification circuit, a source electrode of the first field-effect transistor M0 is connected to a first end of the first resistor R1, a second end of the first resistor R1 is grounded, the first capacitor C2 is connected in parallel with the first resistor R1, a drain electrode of the first field-effect transistor M0 is connected to a first end of the third capacitor C4, a second end of the third capacitor C4 is connected to a field-effect-transistor amplification circuit of the power amplification circuit, a first end of the second capacitor C3 is connected to the gate electrode of the first field-effect transistor M0, and a second end of the second capacitor C3 is grounded.

Herein, when the field-effect-transistor amplification circuit of the power amplification circuit is a single-stage field-effect-transistor amplification circuit, a second end of the third capacitor C4 will be connected to a gate electrode of a field-effect transistor of the single-stage field-effect-transistor amplification circuit. When the field-effect-transistor amplification circuit is a multistage field-effect-transistor amplification circuit, a second end of the third capacitor C4 is connected to a gate electrode of a field-effect transistor of a driving stage in the multistage field-effect-transistor amplification circuit.

In practical applications, when the field-effect transistor amplification circuit of the power amplification circuit includes multiple cascaded field-effect transistors, the third capacitor C4 will be connected to a gate electrode of the field-effect transistor whose source electrode is grounded, within the multiple cascaded field-effect transistors. For instance, as shown in FIG. 5, the field-effect transistor amplification circuit of the power amplification circuit in FIG. 5 includes two cascaded field-effect transistors M1 and M2, where a source electrode of the field-effect transistor M1 is grounded, and thus the third capacitor C4 is connected to a gate electrode of the field-effect transistor M1.

In the linearity compensation circuit, the first capacitor C2 and the first resistor R1 are connected in parallel to the ground to modulate the wave. Since a voltage fluctuation of a DC power supply will cause an excessive ripple, the ripple can be reduced by connecting the first capacitor C2 and the first resistor R1 in parallel to the ground.

The gate electrode of the first field-effect transistor M0 is connected to the second resistor R2 and the second capacitor C3 to protect the components. Because when there is no resistance at the gate electrode, the turn-on speed of the field-effect transistor will be too fast, which may easily breakdown the surrounding components under a high voltage.

The drain electrode of the first field-effect transistor M0 is connected to capacitor to allow an AC signal to pass and a DC signal to be isolated. Since audio signals such as audio signals are AC signals, the serially connected capacitor can isolate DC signals.

Figure 6:
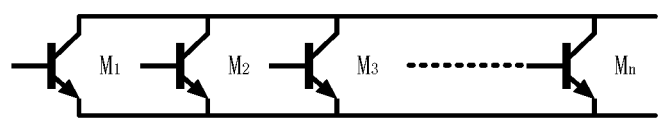
FIG. 6 is a schematic diagram of a circuit structure of a field-effect transistor, provided according to an embodiment of the disclosure.

In the aforementioned embodiment, the field-effect transistor is composed of at least two sub-field-effect transistors that are connected in parallel. For example, the first field-effect transistor M0 may include n field-effect transistors connected in parallel, and n is a natural number equal to or greater than 1. Referring to FIG. 6, there is provided a schematic diagram of a circuit structure of a field-effect transistor, according to an embodiment of the disclosure. As shown in FIG. 6, the field-effect transistor is composed of n field-effect transistors that are in parallel with each other, herein the gate electrode, drain electrode and source electrode of each field-effect transistor are connected to each other respectively. When there is an external circuit that needs to be connected to the electrode of the field-effect transistor, it is only necessary to connect the corresponding electrode of any one of the sub-field-effect transistors. For example, in FIG. 5, when the first end of the second capacitor C3 needs to be connected to the gate electrode of the first field-effect transistor M0, only the gate electrode of any one of the sub-field-effect transistors of the first field effect transistor M0 needs to be connected.

In the aforementioned embodiment, the field-effect transistor includes at least one of: a LDMOS transistor, a SOI transistor, a CMOS transistor, a homogeneous Bipolar BJT or a heterogeneous BJT.

In the power amplifier shown in FIG. 4, the linearity compensation circuit may improve the nonlinearity of the power amplifier. The switching characteristics of the first field-effect transistor M0 in the linearity compensation circuit are utilized mainly, where the field-effect transistor has the characteristics of high input impedance and fast switching speed. When the input power of the power amplifier is small, on-resistance between the DS (Drain electrode-Source electrode) of the field-effect transistor is small, and the first field-effect transistor M0 is in the linear region during the entire AC signal cycle. At this time, the equivalent impedance of the linearity compensation circuit is small. When the input power becomes larger, the drain voltage of the first field-effect transistor M0 rises, and the equivalent impedance of the linearity compensation circuit becomes larger. When the power becomes larger to reach a certain level, the switch of the field-effect transistor is turned off, and the equivalent impedance of the linearity compensation circuit does not change any more. That is, the linearity compensation circuit can be equivalent to a variable resistor connected in parallel with the input of the power amplification circuit to play a role of a matching impedance, so that the input power of the power amplifier matches the impedance. When the input power of the power amplification circuit is small, its equivalent impedance is also small; and when the input power of the power amplifier circuit becomes larger, its equivalent impedance also becomes larger.

The equivalent impedance of the linearity compensation circuit is equivalent to the input impedance of the RF signal input end of the power amplification circuit. As mentioned above, the power gain (Gain) of the power amplifier is inversely proportional to the real part of the port admittance of the RF signal input end, that is, Gain∝1/Re{Yin}, where Re{Yin} is the real part of the admittance. The port admittance is the reciprocal of the input impedance, which means that the greater the input impedance is, the smaller the port admittance is. And the admittance=a real part+an imaginary part, the smaller the admittance is, the smaller the real part of the admittance is, thus when the port admittance becomes smaller, the power gain of the power amplifier becomes larger. Based on the above, the linearity compensation circuit in the embodiments of the disclosure can improve the linear power of the power amplifier without changing the load impedance, such that $P_{-1\ db}$ of the power amplifier is increased and the nonlinearity of the power amplifier is improved. Herein, the $P_{-1\ db}$ refers to the maximum output power of the power amplifier when the gain is compressed by 1 dB.

Figure 7:
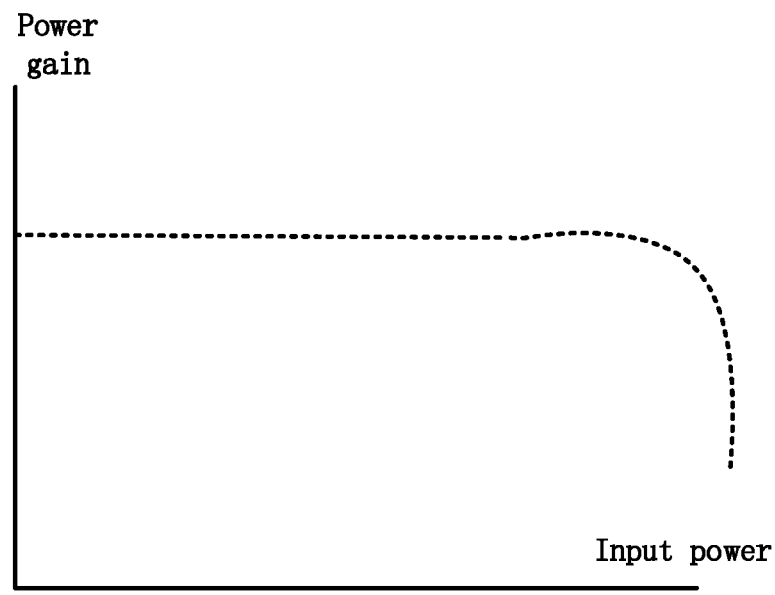
FIG. 7 is a graph of a power gain of another power amplifier varying with the input power, provided according to an embodiment of the disclosure.

Referring to FIG. 7, there is provided a graph of a power gain of a power amplifier varying with the input power, according to an embodiment of the disclosure. As shown in FIG. 7, due to the linearity compensation circuit, the curve is harder and straighter than the curve shown in FIG. 2; and it appears that there are more proportions of straight lines on the curve. The straight line can be understood as the linear region of the power amplifier. In the region, the power gain of the power amplifier keeps the same, where the longer the straight line is, the better the linearity of the power amplifier is. When the power is increased to a certain level, the power amplifier enters the nonlinear region, and at this time, increasing the power will cause the power gain to be lower. The linearity compensation circuit can improve the nonlinearity of the power amplifier to a certain extent, such that the straight line in the linear region becomes longer, and the curve in the nonlinear region becomes flattened or slightly upturned. Therefore, the nonlinearity of the power amplifier and the efficiency of the power amplifier can be improved.

In the aforementioned FIGS. 2 and 7, it is not that the larger the power gain is, the better it is, as long as the power gain is within a certain range, it is easy for the power amplifier to be self-excited when the gain is too large. There are drops at the end of the curve, because the components of the power amplifier is saturated when the power amplifier is at its maximum output power; moreover, increasing the power may burn the components, and the input power cannot be further increased, thus the curve bends downward.

In the embodiments of the disclosure, the nonlinear distortion of the power amplification circuit can be linearly compensated by connecting the linearity compensation circuit between the biasing circuit of the power amplification circuit and the transistor amplification circuit, thereby increasing the power gain of the power amplifier. In the embodiments of the disclosure, the linear power of the power amplifier can be improved without changing the load impedance, such that the nonlinearity of the power amplifier and the efficiency of the power amplifier can be improved.

Figure 8:
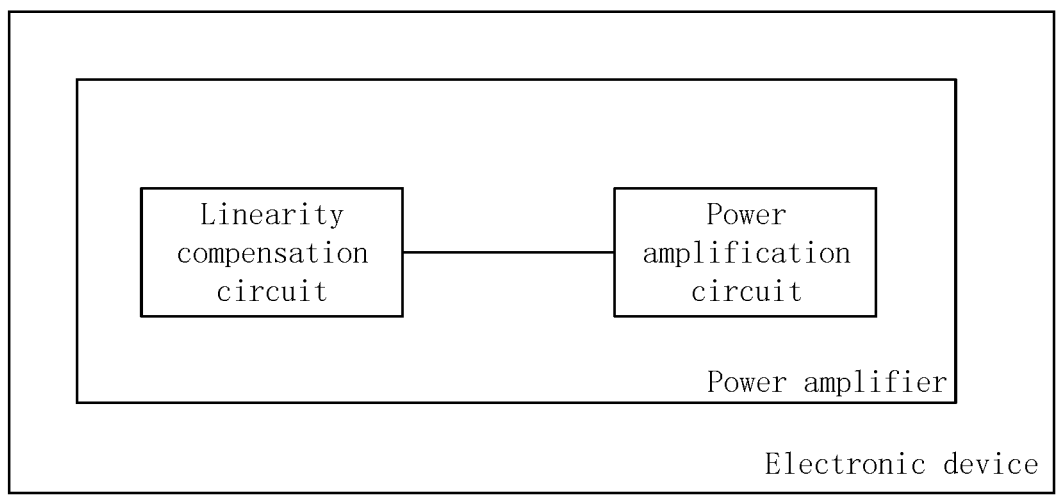
FIG. 8 is a schematic diagram of a structure of an electronic device, provided according to an embodiment of the disclosure.

Referring to FIG. 8, there is provided a schematic diagram of a structure of an electronic device, according to an embodiment of the disclosure. As shown in FIG. 7, the electronic device includes a power amplifier, and the power amplifier includes a power amplification circuit and a linearity compensation circuit.

The power amplifier includes a power amplification circuit and a linearity compensation circuit.

The linearity compensation circuit is connected between a transistor amplification circuit and a biasing circuit of the power amplification circuit, to linearly compensate a nonlinear distortion of the power amplification circuit.

The transistor amplification circuit includes: a field-effect-transistor amplification circuit or a triode amplification circuit.

When the transistor amplification circuit is a field-effect-transistor amplification circuit, the linearity compensation circuit includes: a first field-effect transistor, a first resistor, a second resistor, a first capacitor, a second capacitor, and a third capacitor; and A gate electrode of the first field-effect transistor is connected to a first end of the second resistor, a second end of the second resistor is connected to the biasing circuit, a source electrode of the first field-effect transistor is connected to a first end of the first resistor, a second end of the first resistor is grounded, the first capacitor is connected in parallel with the first resistor, a drain electrode of the first field-effect transistor is connected to a first end of the third capacitor, a second end of the third capacitor is connected to the field-effect-transistor amplification circuit, a first end of the second capacitor is connected to the gate electrode of the first field-effect transistor, and a second end of the second capacitor is grounded.

The field-effect-transistor amplification circuit is a multistage field-effect-transistor amplification circuit, and a second end of the third capacitor is connected to a gate electrode of a field-effect transistor of a driving stage in the multi stage field-effect-transistor amplification circuit.

Each of the field-effect transistors is composed of at least two sub-field-effect transistors that are connected in parallel.

The field-effect transistor includes at least one of: a LDMOS transistor, a SOI transistor, a CMOS transistor, a homogeneous BJT or a heterogeneous BJT.

The electronic device can be a transmitter, a high-frequency heating device or a microwave power source, etc. in a wireless communication system.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure.

That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A power amplifier, comprising:
a power amplification circuit and a linearity compensation circuit;
wherein the linearity compensation circuit is connected between a transistor amplification circuit and a biasing circuit of the power amplification circuit, to linearly compensate a nonlinear distortion of the power amplification circuit;
wherein the transistor amplification circuit comprises: a field-effect-transistor amplification circuit or a triode amplification circuit;
wherein when the transistor amplification circuit is a field-effect-transistor amplification circuit, the linearity compensation circuit comprises: a first field-effect transistor, a first resistor, a second resistor, a first capacitor, a second capacitor, and a third capacitor; and
wherein a gate electrode of the first field-effect transistor is connected to a first end of the second resistor, a second end of the second resistor is connected to the biasing circuit, a source electrode of the first field-effect transistor is connected to a first end of the first resistor, a second end of the first resistor is grounded, the first capacitor is connected in parallel with the first resistor, a drain electrode of the first field-effect transistor is connected to a first end of the third capacitor, a second end of the third capacitor is connected to the field-effect-transistor amplification circuit, a first end of the second capacitor is connected to the gate electrode of the first field-effect transistor, and a second end of the second capacitor is grounded.

2. The power amplifier of claim 1, wherein the field-effect-transistor amplification circuit is a multistage field-effect-transistor amplification circuit, and a second end of the third capacitor is connected to a gate electrode of a field-effect transistor of a driving stage in the multistage field-effect-transistor amplification circuit.

3. The power amplifier of claim 2, wherein each of the field-effect transistors is composed of at least two sub-field-effect transistors that are connected in parallel.

4. The power amplifier of claim 1, wherein the field-effect transistor comprises at least one of: a Laterally-Diffused Metal-Oxide Semiconductor (LDMOS) transistor, a Silicon-On-Insulator (SOI) transistor, a Complementary Metal Oxide Semiconductor (CMOS) transistor, a homogeneous Bipolar Junction Transistor (BJT), or a heterogeneous BJT.

5. An electronic device, comprising: a power amplifier;
wherein the power amplifier comprises: a power amplification circuit and a linearity compensation circuit; and
wherein the linearity compensation circuit is connected between a transistor amplification circuit and a biasing circuit of the power amplification circuit, to linearly compensate a nonlinear distortion of the power amplification circuit based on an input power of the power amplification circuit;

wherein the transistor amplification circuit comprises multiple cascaded elements including a first cascaded element having an end grounded; and wherein the linearity compensation circuit is connected to an end of the first cascaded element;

wherein the transistor amplification circuit comprises: a field-effect-transistor amplification circuit or a triode amplification circuit;

wherein when the transistor amplification circuit is a field-effect-transistor amplification circuit, the linearity compensation circuit comprises: a first field-effect transistor, a first resistor, a second resistor, a first capacitor, a second capacitor, and a third capacitor; and wherein a gate electrode of the first field-effect transistor is connected to a first end of the second resistor, a second end of the second resistor is connected to the biasing circuit, a source electrode of the first field-effect transistor is connected to a first end of the first resistor, a second end of the first resistor is grounded, the first capacitor is connected in parallel with the first resistor, a drain electrode of the first field-effect transistor is connected to a first end of the third capacitor, a second end of the third capacitor is connected to the field-effect-transistor amplification circuit, a first end of the second capacitor is connected to the gate electrode of the first field-effect transistor, and a second end of the second capacitor is grounded.

6. A communication system comprising a power amplifier, comprising:

a power amplification circuit and a linearity compensation circuit;

wherein the linearity compensation circuit is connected between a transistor amplification circuit and a biasing circuit of the power amplification circuit, to linearly compensate a nonlinear distortion of the power amplification circuit based on an input power of the power amplification circuit;

wherein the transistor amplification circuit comprises multiple cascaded elements including a first cascaded element having an end grounded; and wherein the linearity compensation circuit is connected to an end of the first cascaded element;

wherein the linearity compensation circuit disposed between the biasing circuit of the power amplification circuit and the transistor amplification circuit is configured to increase power gain and linear power of the power amplifier without changing a load impedance, thereby improving nonlinearity and efficiency of the power amplifier;

wherein the transistor amplification circuit comprises: a field-effect-transistor amplification circuit or a triode amplification circuit;

wherein when the transistor amplification circuit is a field-effect-transistor amplification circuit, the linearity compensation circuit comprises: a first field-effect transistor, a first resistor, a second resistor, a first capacitor, a second capacitor, and a third capacitor; and wherein a gate electrode of the first field-effect transistor is connected to a first end of the second resistor, a second end of the second resistor is connected to the biasing circuit, a source electrode of the first field-effect transistor is connected to a first end of the first resistor, a second end of the first resistor is grounded, the first capacitor is connected in parallel with the first resistor, a drain electrode of the first field-effect transistor is connected to a first end of the third capacitor, a second end of the third capacitor is connected to the field-effect-transistor amplification circuit, a first end of the second capacitor is connected to the gate electrode of the first field-effect transistor, and a second end of the second capacitor is grounded.

7. The communication system of claim 6, wherein the field-effect-transistor amplification circuit is a multistage field-effect-transistor amplification circuit, and a second end of the third capacitor is connected to a gate electrode of a field-effect transistor of a driving stage in the multistage field-effect-transistor amplification circuit.

8. The communication system of claim 7, wherein each of the field-effect transistors is composed of at least two sub-field-effect transistors that are connected in parallel.

9. The communication system of claim 6, wherein the field-effect transistor comprises at least one of: a Laterally-Diffused Metal-Oxide Semiconductor (LDMOS) transistor, a Silicon-On-Insulator (SOI) transistor, a Complementary Metal Oxide Semiconductor (CMOS) transistor, a homogeneous Bipolar Junction Transistor (BJT), or a heterogeneous BJT.

10. The communication system of claim 6, wherein the transistor amplification circuit comprises a triode amplification circuit.

* * * * *